(12) United States Patent
Lee et al.

(10) Patent No.: US 12,080,199 B2
(45) Date of Patent: Sep. 3, 2024

(54) DISPLAY DEVICE

(71) Applicant: Samsung Display Co., LTD., Yongin-si (KR)

(72) Inventors: Jae Been Lee, Yongin-si (KR); Yi Joon Ahn, Yongin-si (KR); Eun Kyung Yeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 498 days.

(21) Appl. No.: 17/332,939

(22) Filed: May 27, 2021

(65) Prior Publication Data

US 2022/0036775 A1 Feb. 3, 2022

(30) Foreign Application Priority Data

Jul. 29, 2020 (KR) .................. 10-2020-0094802

(51) Int. Cl.
*G09F 9/302* (2006.01)
*G09F 9/33* (2006.01)
*H01L 27/15* (2006.01)
*H01L 33/38* (2010.01)

(52) U.S. Cl.
CPC ............. *G09F 9/3026* (2013.01); *G09F 9/33* (2013.01); *H01L 27/156* (2013.01); *H01L 33/382* (2013.01)

(58) Field of Classification Search
CPC ....... G09F 9/3026; G09F 9/33; H01L 27/156; H01L 33/382; H01L 25/0753; H10K 59/131; H10K 59/18; H10K 59/121
See application file for complete search history.

(56) References Cited

U.S. PATENT DOCUMENTS 6,057,898 A * 5/2000 Itoh ................ G02F 1/13336
349/160
2018/0188579 A1 7/2018 Jeong et al.

FOREIGN PATENT DOCUMENTS

KR 10-2018-0079080 7/2018

OTHER PUBLICATIONS

"Visualisation systems", Humanities, Oct. 16, 2020, p. 1-3, Curtin University, Australia.

* cited by examiner

*Primary Examiner* — Su C Kim
(74) *Attorney, Agent, or Firm* — Lewis Roca Rothgerber Christie LLP

(57) ABSTRACT

A display device includes a first display panel including a first substrate, and a second display panel adjacent to the first display panel in a first direction and including a second substrate. One side surface of each of the first and second substrates adjacent to a first boundary between the first display panel and the second display panel includes an uneven pattern, the uneven pattern of the first substrate includes a plurality of first convex portions and a plurality of first concave portions between the first convex portions, the uneven pattern of the second substrate includes a plurality of second convex portions and a plurality of second concave portions between the second convex portions, each of the first convex portions includes at least one first hole passing through the first substrate, and each of the second convex portions includes at least one second hole passing through the second substrate.

21 Claims, 13 Drawing Sheets

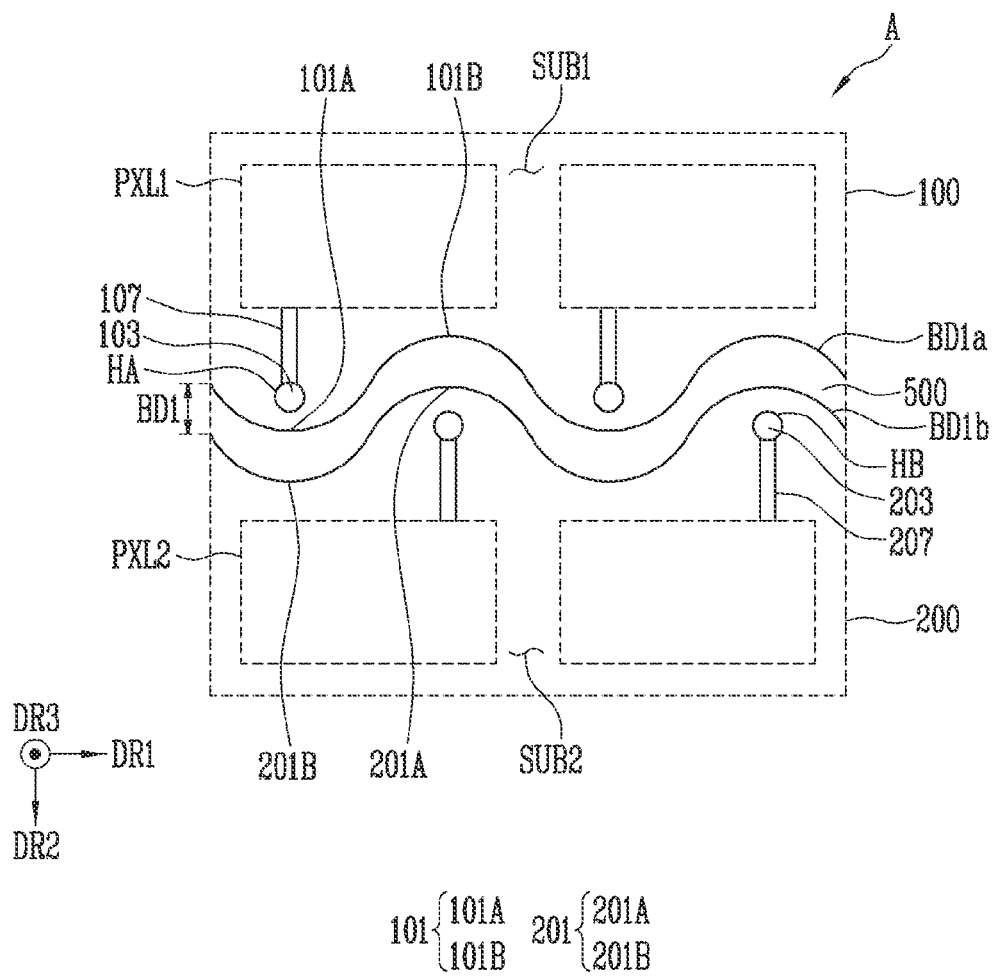

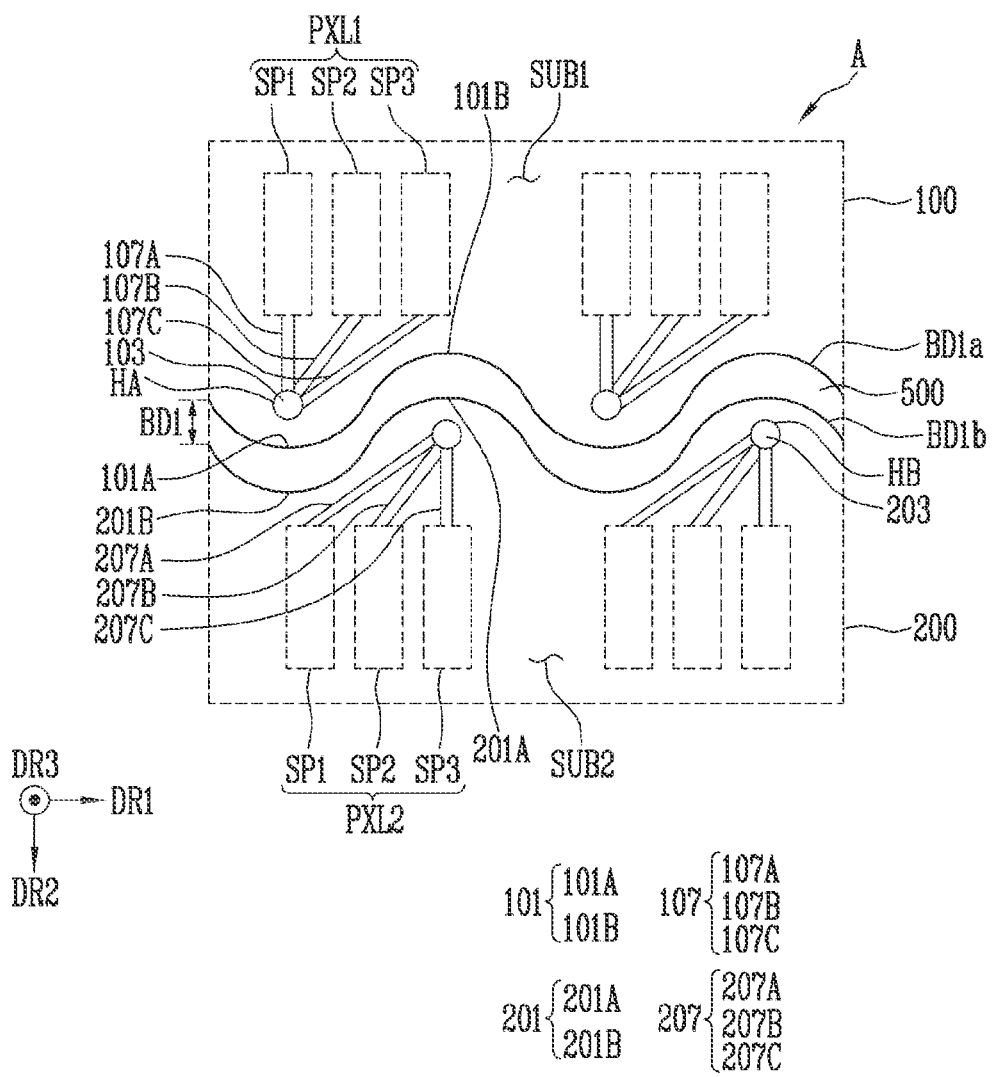

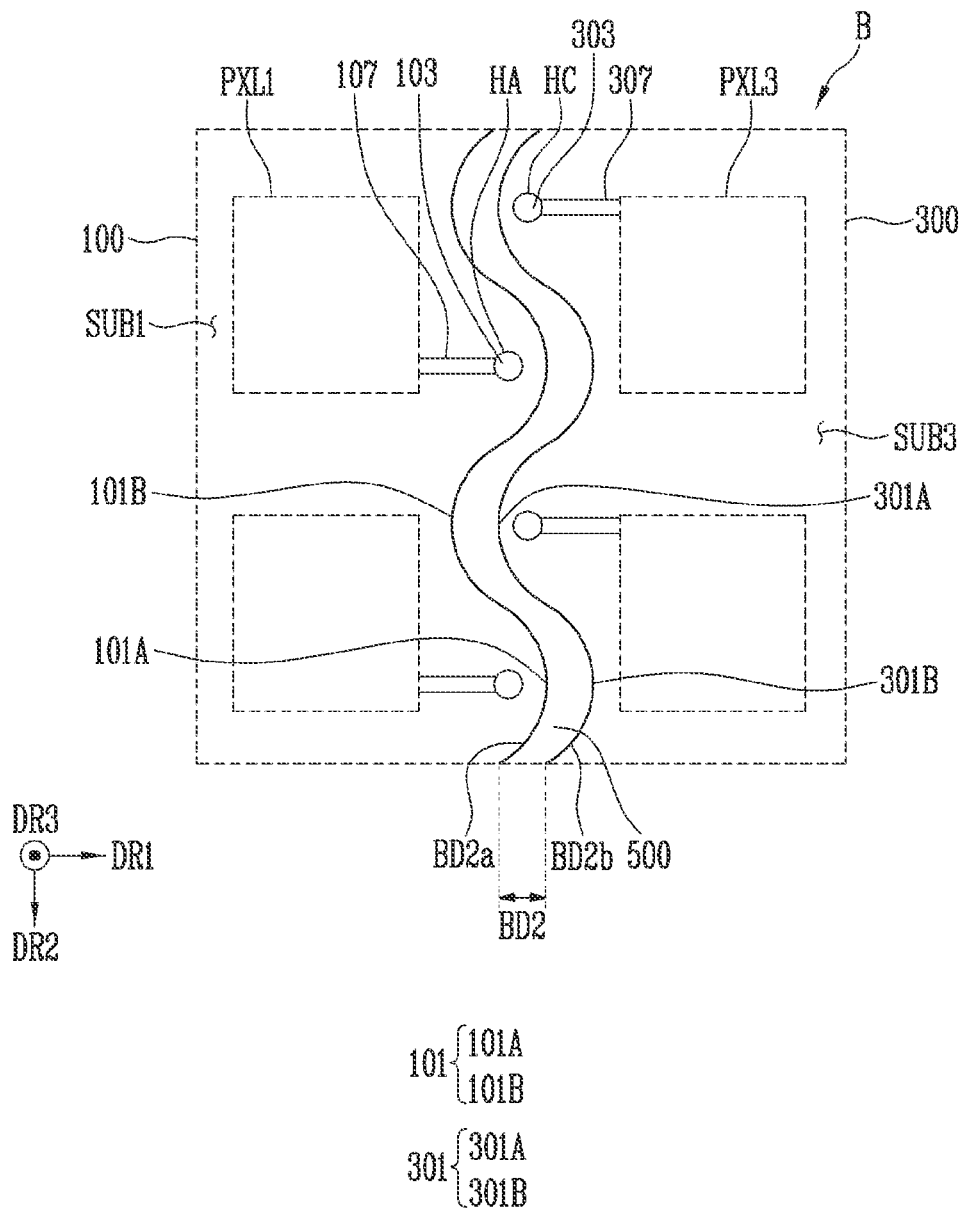

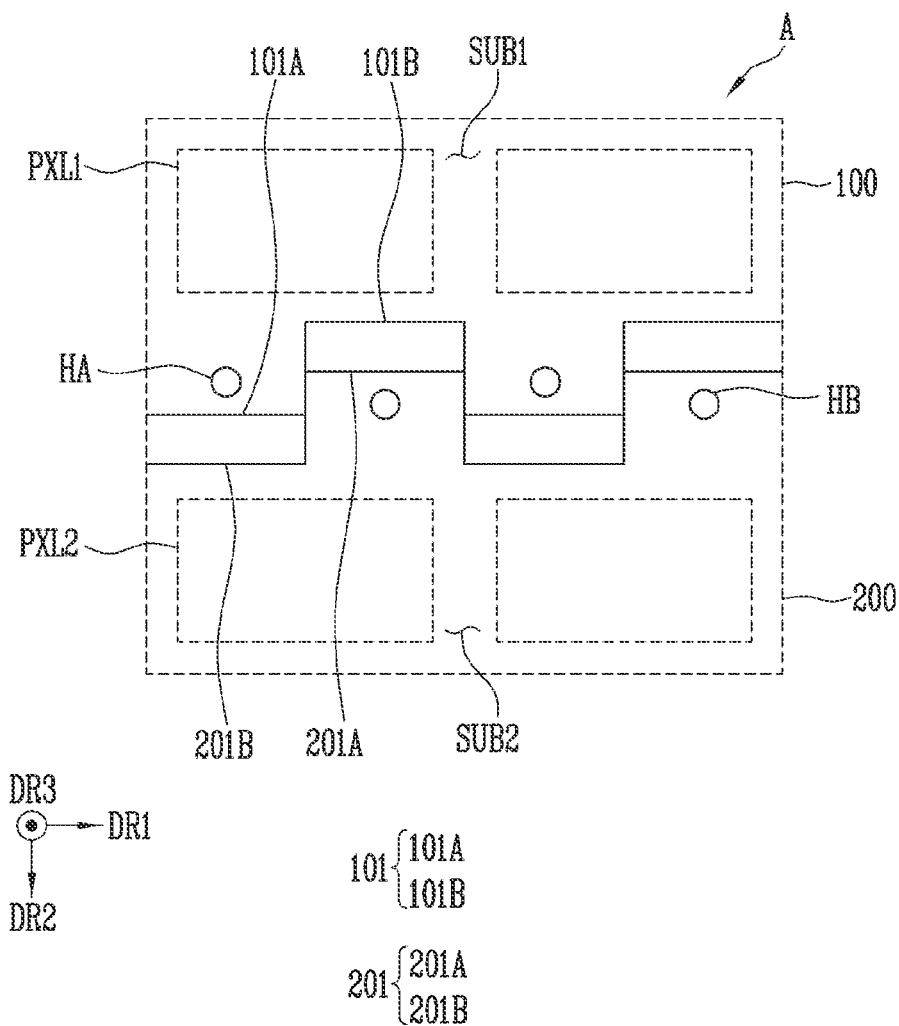

DISPLAY DEVICE

CROSS-REFERENCE TO RELATED APPLICATION

This application claims priority to and the benefit of Korean Patent Application No. 10-2020-0094802, filed on Jul. 29, 2020, the entire content of which is hereby incorporated by reference.

BACKGROUND

1. Field

The disclosure relates to a display device capable of implementing one large screen by disposing a plurality of display panels in a tile form.

2. Description of the Related Art

An application range of a display device has expanded, and thus, not only an everyday electronic device but also a screen of a super-large area are demanded. However, when the display device is manufactured with a super-large area screen, there is a problem that a volume of a display element is increased and image quality is reduced.

In order to address this problem and meet the demand for increasing the display area of the display device, a tiled display device that implements one large screen by connecting a plurality of display panels in a tiled form is proposed.

However, because the tiled display device is implemented by connecting the plurality of display panels, there is a problem that a boundary between adjacent display panels is visually recognizable on a large screen due to non-display areas where an image of each display panel is not displayed.

SUMMARY

An aspect of the present disclosure is directed towards a display device that minimizes or reduces visual recognition of a boundary between adjacent display panels.

The aspects of the present disclosure are not limited to the aspect described above, and other aspects that are not described will be clearly understood by those of ordinary skill in the art from the following description.

A display device according to an embodiment of the disclosure may include a first display panel including a first substrate and at least one first pixel on one surface of the first substrate, and a second display panel adjacent to the first display panel in a first direction and including a second substrate and at least one second pixel on one surface of the second substrate. Here, one side surface of each of the first and second substrates adjacent to a first boundary between the first display panel and the second display panel may include an uneven pattern.

In an embodiment, the uneven pattern of the first substrate may include a plurality of first convex portions and a plurality of first concave portions between the first convex portions. The uneven pattern of the second substrate may include a plurality of second convex portions and a plurality of second concave portions between the second convex portions.

In an embodiment, each of the first convex portions may include at least one first hole passing through the first substrate, and each of the second convex portions may include at least one second hole passing through the second substrate.

In an embodiment, the first hole and the second hole may be alternately arranged with each other along a second direction different from the first direction in a plan view.

In an embodiment, each of the first convex portions may be convex toward the second pixel, and each of the first concave portions may be concave toward the first pixel, in the plan view. In addition, each of the second convex portions may be convex toward the first pixel, and each of the second concave portions may be concave toward the second pixel, in the plan view.

In an embodiment, the first convex portions and the second convex portions may be alternately arranged with each other along the second direction. In addition, the first concave portions and the second concave portions may be alternately arranged with each other along the second direction.

In an embodiment, each of the first convex portions and the second concave portions (e.g., a corresponding one of the second concave portions) may face each other in the first direction. In addition, each of the second convex portions and each of the first concave portions (e.g., a corresponding one of the first concave portions) may face each other in the first direction.

In an embodiment, each of the first concave portions may have a shape complementary to each of (e.g., to a corresponding one of) the second convex portions. In addition, each of the second concave portions may have a shape complementary to each of (e.g., to a corresponding one of) the first convex portions.

In an embodiment, each of the first convex portions and each of the second convex portions may include a non-square boundary.

In an embodiment, each of the first convex portions and each of the second convex portions may have a polygonal shape or a rounded curved shape.

In an embodiment, the first display panel may further include at least one first line connector on the one surface of the first substrate and electrically coupled (e.g., connected) to the first pixel, and a first connection electrode inside the first hole and electrically coupled (e.g., connected) to the first line connector. In addition, the second display panel may further include at least one second line connector on the one surface of the second substrate and electrically coupled (e.g., connected) to the second pixel, and a second connection electrode inside the second hole and electrically coupled (e.g., connected) to the second line connector.

In an embodiment, the first line connector and the first connection electrode may be integrally provided, and the second line connector and the second connection electrode may be integrally provided.

In an embodiment, the first display panel may further include a driving circuit on another surface of the first substrate facing away (e.g., oppositely away) from the one surface of the first substrate, and a driving connector on the other surface of the first substrate and electrically coupling (e.g., connecting) the driving circuit and the first connection electrode.

In an embodiment, the driving connector and the first connection electrode may be integrally provided.

In an embodiment, the first line connector, the first connection electrode, and the driving connector may be integrally provided.

In an embodiment, the first pixel may include a first sub pixel, a second sub pixel, and a third sub pixel. Here, the first line connector may include a (1-1)-th line connector electrically coupled (e.g., connected) to the first sub pixel, a (1-2)-th line connector electrically coupled (e.g., connected)

to the second sub pixel, and a (1-3)-th line connector electrically coupled (e.g., connected) to the third sub pixel.

In an embodiment, each of the (1-1)-th to (1-3)-th line connectors may be electrically coupled (e.g., connected) to the first connection electrode.

In an embodiment, the number of the first holes and the number of the first pixels may be the same.

In an embodiment, the display device may further include a third display panel adjacent to the first display panel in a second direction different from the first direction, and including a third substrate and at least one third pixel on one surface of the third substrate. Here, one side surface of the third substrate adjacent to a second boundary between the first display panel and the third display panel may include an uneven pattern.

In an embodiment, the uneven pattern of the third substrate may include a plurality of third convex portions and a plurality of third concave portions between the third convex portions. Here, each of the third convex portions may include at least one third hole passing through the third substrate.

In an embodiment, the display device may further include a connection portion provided at (e.g., on) the first boundary between the first display panel and the second display panel. Here, the connection portion may include (e.g., be) a transparent adhesive material.

According to an aspect of the disclosure, visual recognition of a boundary between a plurality of display panels included in a display device may be minimized or reduced.

Aspects and features of the disclosure are not limited to the aspects and features described above, and aspects and features that are not described will be clearly understood by those of ordinary skill in the art from the present specification and the accompanying drawings.

BRIEF DESCRIPTION OF THE DRAWINGS

The above and other features of the disclosure will become more apparent by describing in more detail embodiments thereof with reference to the accompanying drawings, in which:

FIGS. 4A and 4B are enlarged plan views of a region A of FIG. 1;

FIG. 6 is an enlarged plan view of the region A of FIG. 1 according to another embodiment;

FIG. 7 is an enlarged plan view of a region B of FIG. 1;

FIGS. 8A and 8B are enlarged plan views of the region A of FIG. 1 according to still another embodiment.

DETAILED DESCRIPTION

Figure 1:
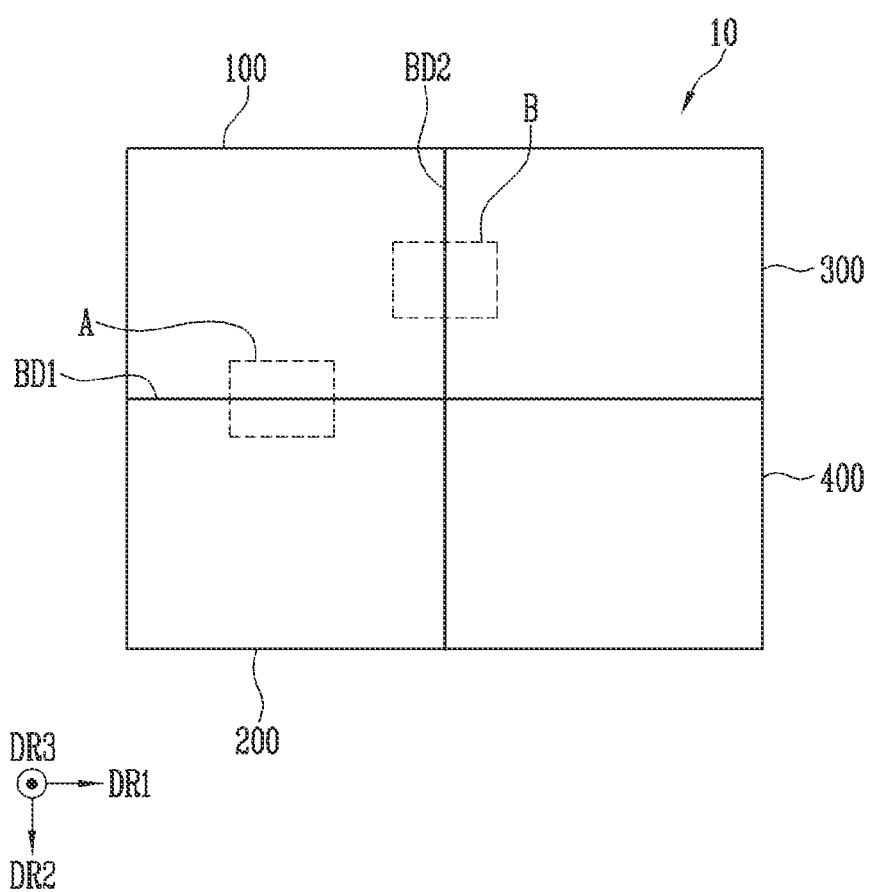
FIG. 1 is a plan view schematically illustrating a display device according to an embodiment.

Because the embodiments described in the present specification are for clearly describing the spirit of the present disclosure to those of ordinary skill in the art to which the present disclosure pertains, the disclosure is not limited by the embodiments described in the present specification, and the scope of the present disclosure should be interpreted as including suitable modifications and/or variations that do not depart from the spirit of the present disclosure. As used herein, the use of the term "may," when describing embodiments of the present disclosure, refers to "one or more embodiments of the present disclosure." As used herein, the term "and/or" includes any and all combinations of one or more of the associated listed items.

Although the terms used in the present specification are selected as general terms that are currently widely used in consideration of a function of the present disclosure, the terms may vary according to the intention of those skilled in the art to which the present disclosure pertains, customs, the appearance of new technologies, or the like. However, when a term is defined and used, the meaning of the term will be described separately. Therefore, the terms used in the present specification should be interpreted based on the actual meaning of the term and the contents throughout the present specification, other than a name of a simple term.

The drawings attached to the present specification are provided for ease of description of the present disclosure. Because the shapes shown in the drawings may be exaggerated and displayed as necessary to help understand the present disclosure, the present disclosure is not limited by the drawings.

In the present specification, when it is determined that detailed description of a known configuration or function related to the present disclosure may obscure the subject matter of the present disclosure, detailed description thereof may be omitted as necessary for clarity of description.

The disclosure relates to a display device (for example, a tiled display device) capable of implementing one large screen by disposing a plurality of display panels in a tile form.

Hereinafter, a display device according to an embodiment of the disclosure is described with reference to FIGS. 1 to 14.

FIG. 1 is a plan view schematically illustrating a display device according to an embodiment.

In an embodiment of the disclosure, for convenience of description, a transverse direction (or a horizontal direction) on a plane is indicated as a first direction DR1, a longitudinal direction or (a vertical direction) on the plane is indicated as a second direction DR2, and a thickness direction of a substrate SUB on a cross section is indicated as a third direction DR3. The first to third directions DR1, DR2, and DR3 may refer to directions indicated by the first to third directions DR1, DR2, and DR3, respectively.

The display device 10 may include a plurality of display panels 100, 200, 300, and 400. For example, the display device 10 may include a first display panel 100, a second display panel 200, a third display panel 300, and a fourth display panel 400. The first to fourth display panels 100, 200, 300, and 400 may be arranged side by side so that each display area on which an image is displayed faces in one direction (for example, the third direction DR3). For example, the first to fourth display panels 100, 200, 300, and 400 may be arranged with each other in or on a plane (e.g., in or on a plane defined by the first and second directions DR1 and DR2) so that the first to fourth display panels 100, 200, 300, and 400 face the same direction (e.g., the third direction DR3). The first to fourth display panels 100, 200, 300, and 400 may have the same size (or area), but the disclosure is not limited thereto. According to an embodiment, each of the first to fourth display panels 100, 200, 300, and 400 may have a size (or area) different from that of adjacent display panels to meet a design condition or the like of the applied display device 10.

The display device 10 may provide one image (e.g., one integral image) to a user through the plurality of display panels 100, 200, 300, and 400 arranged side by side in the first direction DR1 and/or the second direction DR2 on a horizontal plane. For example, the user may recognize one image information provided from the display device 10 through a large screen corresponding to the area in which the plurality of display panels 100, 200, 300 and 400 are combined. As necessary, the display device 10 may provide a plurality of different images (e.g., separate or independent images) through the plurality of display panels 100, 200, 300, and 400. For example, the plurality of display panels 100, 200, 300, and 400 may collectively display a single image, or each display panel of the plurality of display panels 100, 200, 300, and 400 may display a separate image independent of the images displayed by the other display panels. However, the present disclosure is not limited thereto. For example, one group of display panels of the plurality of display panels 100, 200, 300, and 400 may display a first image, and another group of display panels of the plurality of display panels 100, 200, 300, and 400 may display a second image independent of the first image.

Referring to FIG. 1, the display device 10 may include a first boundary portion BD1 and a second boundary portion BD2. The first boundary portion BD1 and the second boundary portion BD2 may be a seam (or joint) of the display device 10, but the disclosure is not limited thereto.

The first boundary portion BD1 may be provided between the first display panel 100 and the second display panel 200 and between the third display panel 300 and the fourth display panel 400 disposed side by side in one direction, for example, the second direction DR2.

The second boundary portion BD2 may be provided between the first display panel 100 and the third display panel 300 and between the second display panel 200 and the fourth display panel 400 disposed side by side in a direction different from the second direction DR2, for example, the first direction DR1 crossing the second direction DR2.

For convenience of illustration, in FIG. 1, a shape corresponding to the boundary portions BD1 and BD2 of the display panels 100, 200, 300 and 400 is shown as having a shape of a straight line extending along the first direction DR1 or the second direction DR2. However, this is shown to schematically illustrate the display device 10, and example shapes and structures are described later with reference to FIGS. 4A to 14.

FIG. 1 shows a case where the display device 10 includes four display panels 100, 200, 300, and 400 as an example, but the disclosure is not limited thereto. For example, the display device 10 may include two or more display panels.

Figure 2:
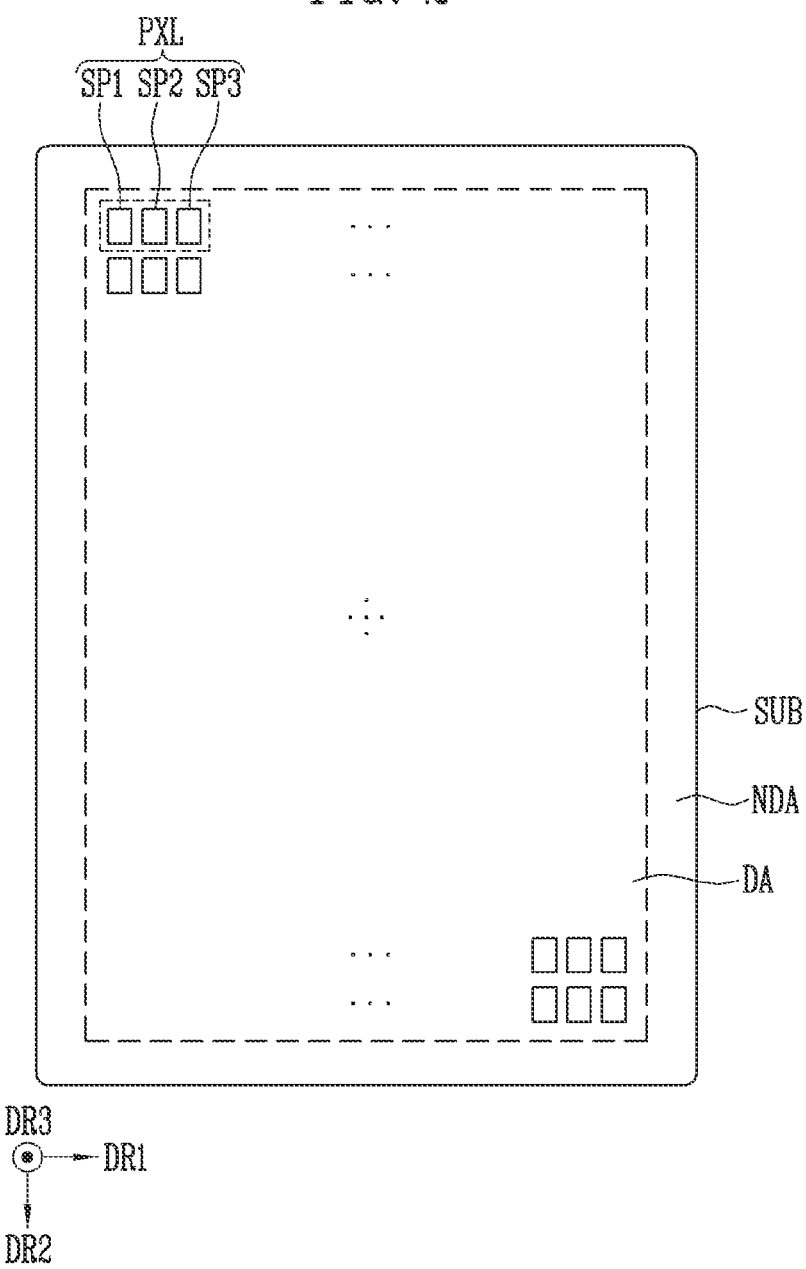
FIG. 2 is a plan view schematically illustrating an example of one display panel configuring the display device (e.g., one display panel of the display device) according to an embodiment.

FIG. 2 is a plan view schematically illustrating an example of one display panel configuring the display device (e.g., one display panel of the display device) according to an embodiment. For reference, the display panel of FIG. 2 may have the same configuration (e.g., may correspond to or may be the same as) as the first display panel of the display device 10 of FIG. 1.

In FIG. 2, for convenience, a structure of the display panel is schematically shown centering on a display area where an image is to be displayed. However, according to an embodiment, at least one driving circuit (for example, a scan driver and a data driver) and/or a plurality of signal lines may be further disposed on the display panel.

Referring to FIG. 2, the display panel configuring the display device (refer to 10 of FIG. 1) may include a substrate SUB, pixels PXL provided on the substrate SUB and including at least one light emitting element, a driving portion provided on the substrate SUB to drive the pixels PXL, and a line portion coupling (e.g., connecting) the pixels PXL and the driving portion.

The display panel may be classified into (e.g., may be classified as) a passive matrix type (e.g., kind or category of) display panel or an active matrix type (e.g., kind or category of) display panel according to a method of driving a light emitting element. For example, when the display panel is implemented as an active matrix type, each of the pixels PXL may include a driving transistor that controls an amount of current supplied to the light emitting element, a switching transistor to transfer a data signal to the driving transistor, and the like.

Recently, an active matrix type display device (e.g., an active matrix display device) that selects and lights each pixel PXL in a viewpoint of a contrast and an operation speed has become the mainstream, but the disclosure is not limited thereto, and a passive matrix type display device (e.g., a passive matrix display device) in which lighting is performed for each pixel PXL group may also utilize (e.g., use) components (for example, first and second electrodes) for driving the light emitting element.

The substrate SUB may include a display area DA and a non-display area NDA.

According to an embodiment, the display area DA may be disposed in a central area of the display panel, and the non-display area NDA may be disposed in an edge area of the display panel so as to surround (e.g., partially or entirely surround) the display area DA. However, positions of the display area DA and the non-display area NDA are not limited thereto, and the positions thereof may be suitably changed.

The display area DA may be an area where the pixels PXL for displaying an image are provided. The non-display area NDA may be an area where the driver for driving the pixels PXL and a portion of the line portion for coupling (e.g., connecting) the pixels PXL and the driver with each other are provided.

The display area DA may have various suitable shapes. For example, the display area DA may be provided in various suitable shapes such as a closed polygon (including sides formed of straight lines, a circle, an ellipse, and/or the like) including a side formed of a curved line, and/or as a semicircle, a semi-ellipse, and/or the like including a side formed of a straight line and a curved line.

The non-display area NDA may be provided on at least one side of the display area DA. In an embodiment of the disclosure, the non-display area NDA may surround a periphery of the display area DA.

The substrate SUB may include (e.g., be) a transparent insulating material and may transmit light. The substrate SUB may be a suitably rigid substrate. For example, the substrate SUB may be one of a glass substrate, a quartz substrate, a glass ceramic substrate, and a crystalline glass substrate.

In addition, the substrate SUB may be a suitably flexible substrate. Here, the substrate SUB may be one of a film substrate and a plastic substrate including (e.g., being) a polymer organic material. For example, the substrate SUB may include (e.g., be) at least one selected from among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring (e.g., forming or composing) the substrate SUB may be variously and suitably changed, and may include, for example, fiber reinforced plastic (FRP) and/or the like.

Each of the pixels PXL may be provided in the display area DA on the substrate SUB. Each of the pixels PXL may display an image and a plurality of pixels PXL may be provided.

Each pixel PXL may include a light emitting element that is to be driven by corresponding scan signal(s) and data signal(s).

In addition, each pixel PXL may include a plurality of sub pixels. For example, each pixel PXL may include a first sub pixel SP1, a second sub pixel SP2, and a third sub pixel SP3.

The driver may provide a signal to each pixel PXL through the line portion, and thus the driver may control driving of each pixel PXL. In FIG. 2, the line portion is omitted for convenience of description.

The driver may include a scan driver to provide a scan signal to the pixels PXL through a scan line, an emission driver to provide an emission control signal to the pixels PXL through an emission control line, a data driver to provide a data signal to the pixels PXL through a data line, a timing controller, and a voltage supply. The timing controller may control the scan driver, the light emission driver, and the data driver, and the voltage supply may supply a voltage of driving power through power lines.

Figure 3:
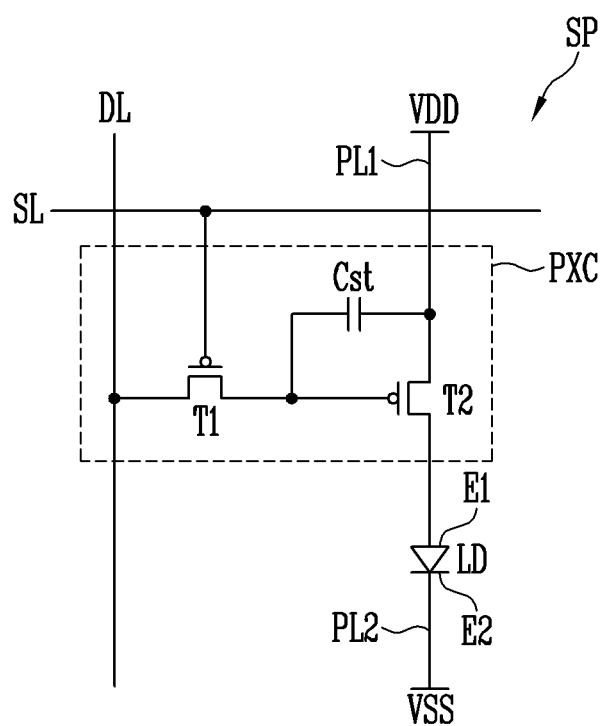
FIG. 3 is an equivalent circuit diagram of a sub pixel included in one of pixels shown in FIG. 2.

FIG. 3 is an equivalent circuit diagram of the sub pixel included in one of (e.g., one or more of) the pixels shown in FIG. 2.

In FIG. 3, one sub pixel SP may be any one of the first to third sub pixels SP1, SP2, and SP3 included in one pixel PXL shown in FIG. 2. The first to third sub pixels SP1, SP2, and SP3 may have substantially the same or similar structure.

Referring to FIG. 3, the sub pixel SP may be coupled (e.g., connected) to a plurality of signal lines. As shown in FIG. 3, the signal lines may include a scan line SL, a data line DL, a first power line PL1, and a second power line PL2, but the disclosure is not limited thereto. In addition, various suitable signal lines may be electrically coupled (e.g., connected) to the sub pixel SP.

The sub pixel SP may include a light emitting element LD, a first electrode E1, a second electrode E2, and a sub pixel circuit PXC.

The light emitting element LD may be configured of (e.g., may include or be) an organic light emitting diode or an inorganic light emitting diode. In some embodiments, the light emitting element LD may be a light emitting element configured of organic and inorganic materials in combination.

According to an embodiment, the light emitting element LD may have a size as small as nano scale to micro scale, for example, a diameter and/or a length of a nano scale or micro scale range. For example, in some embodiments, a length of the light emitting element LD may be equal to or greater than $10^{-9}$ meters and equal to or less than $10^{-3}$ meters. However, the size of the light emitting element LD is not limited thereto. For example, the size of the light emitting element LD may be variously and suitably changed according to a design condition of various suitable devices utilizing (e.g., using) a light emitting device utilizing (e.g., using) the light emitting element LD as a light source, for example, a display device.

FIG. 3 shows the light emitting element LD as a single configuration, but the disclosure is not limited thereto. For example, a plurality of light emitting elements LD may be configured, and the plurality of light emitting elements LD may be coupled (e.g., connected) to each other in series, in parallel, or in series and parallel.

The first electrode E1 of the light emitting element LD is coupled (e.g., connected) to a first driving power VDD via the sub pixel circuit PXC, and the second electrode E2 of the light emitting element LD is coupled (e.g., connected) to a second driving power VSS. The first electrode E1 may be an anode electrode, and the second electrode E2 may be a cathode electrode, but the present disclosure is not limited thereto.

The sub pixel circuit PXC may include a first transistor T1, a storage capacitor Cst, and a second transistor T2. This is merely illustrative, and the number of transistors and capacitors included in the sub pixel circuit PXC is not limited to that shown in FIG. 3. For example, according to another embodiment of the disclosure, the sub pixel circuit PXC may further include a plurality of transistors and a plurality of capacitors.

The first transistor T1 may be a switching transistor that controls on-off of the sub pixel SP. The first transistor T1 may transfer or block the data signal transferred through the data line DL in response to the scan signal transferred through the scan line SL.

The storage capacitor Cst is coupled (e.g., connected) to the first transistor T1 and the first power line PL1. The storage capacitor Cst charges a charge amount corresponding to a voltage difference between the data signal transferred from the first transistor T1 and the first driving power VDD (e.g., the voltage of the first driving power source VDD) applied to the first power line PL1.

The second transistor T2 is coupled (e.g., connected) to the first transistor T1, the storage capacitor Cst, and the light emitting element LD. The second transistor T2 controls a driving current flowing through the light emitting element LD in correspondence with the charge amount stored in the storage capacitor Cst. A turn-on time of the second transistor T2 may be determined according to the charge amount charged in the storage capacitor Cst.

According to an embodiment, the first transistor T1 and the second transistor T2 are provided as P-type (e.g., P-channel) transistors, but are not limited thereto. According to another embodiment, the first transistor T1 and the second transistor T2 may be provided as N-type (e.g., N-channel) transistors. According to still another embodiment, one of the first transistor T1 and the second transistor T2 may be provided as an N-type transistor and the other may be provided as a P-type transistor.

The light emitting element LD is coupled (e.g., connected) to the second transistor T2 and the second power line PL2. For example, the first electrode E1 of the light emitting element LD may be electrically coupled (e.g., connected) to the second transistor T2 and the second electrode E2 may be coupled (e.g., connected) to the second power line PL2. The first electrode E1 may be electrically coupled (e.g., connected) to the sub pixel circuit PXC, and the second electrode E2 may receive a voltage of the second driving power VSS (e.g., the voltage of the second driving power source VSS) through the second power line PL2.

Figure 4B:
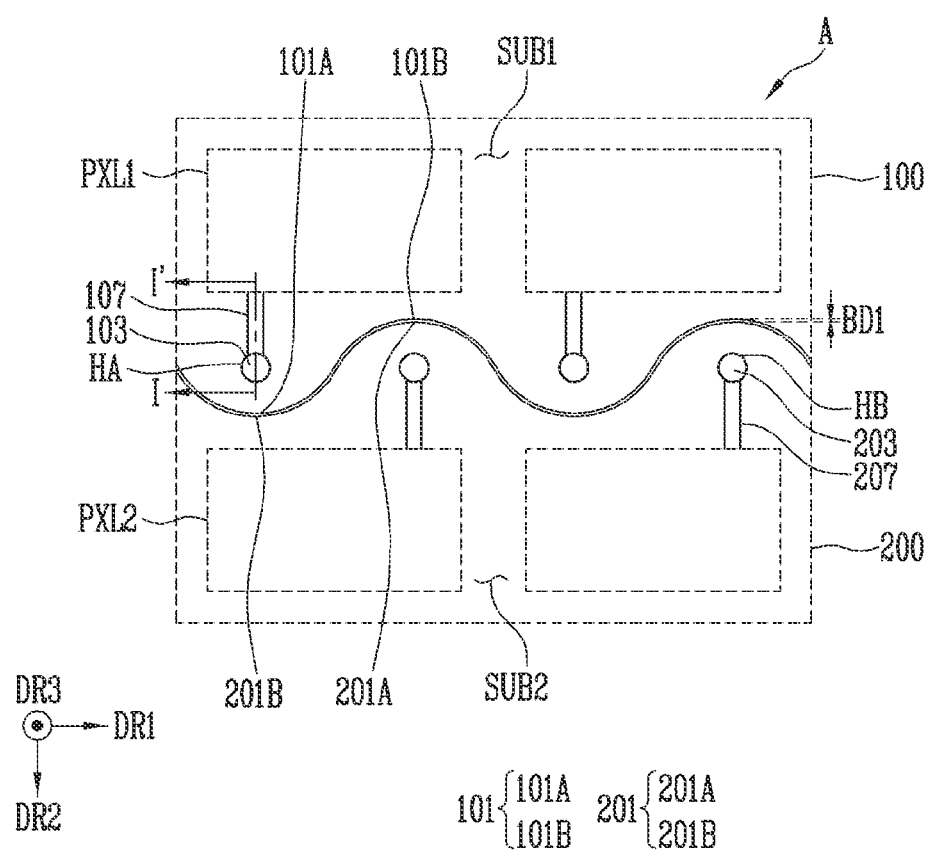

FIGS. 4A and 4B are enlarged plan views of a region A of FIG. 1.

Referring to FIGS. 1, 4A and 4B, the first display panel 100 and the second display panel 200 may be disposed adjacent to each other in the second direction DR2.

The first display panel 100 may include a first substrate SUB1 and at least one first pixel PXL1 provided on the first substrate SUB1. The second display panel 200 may include a second substrate SUB2 and at least one second pixel PXL2 provided on the second substrate SUB2. Here, each of the first and second substrates SUB1 and SUB2 may be the substrate SUB (e.g., each of the first and second substrates SUB1 and SUB2 may have the same composition and/or structure as the substrate SUB) described with reference to FIG. 2, and each of the first and second pixels PXL1 and PXL2 may be each pixel PXL (e.g., each of the first and second pixels PXL1 and PXL2 may have the same structure and/or configuration as the pixel PXL) described with reference to FIG. 2. Therefore, detailed descriptions of the first and second substrates SUB1 and SUB2 and of the first and second pixels PXL1 and PXL2 may not be provided.

A first boundary portion BD1 may be positioned between one side surface BD1a (hereinafter referred to as a 'first side surface') of the first substrate SUB1 and one side surface BD1b (hereinafter referred to as a 'second side surface') of the second substrate SUB2 facing each other in the second direction DR2. A connection portion 500 that connects (or couples) the first display panel 100 and the second display panel 200 to each other may be provided at (e.g., on) the first boundary portion BD1.

Each of the first and second side surfaces BD1a and BD1b may have a pattern, for example, uneven patterns 101 and 201 on a plan view. For example, the first side surface BD1a may have a first uneven pattern 101, and the second side surface BD1b may have a second uneven pattern 201. In some embodiments, each of the first and second side surfaces BD1a and BD1b may have discontinuous patterns.

The first uneven pattern 101 may include a plurality of first convex portions 101A and a plurality of first concave portions 101B. Here, each of the first concave portions 101B may be provided between two adjacent first convex portions 101A.

Each of the first convex portions 101A may be provided to protrude in a direction from the first side surface BD1a of the first substrate SUB1 toward the second pixel PXL2 on the plan view, and each of the first concave portions 101B may be concave in a direction opposite to the direction in which the first convex portions 101A protrude. For example, each of the first concave portions 101B may be provided to be concave in a direction toward the first pixel PXL1. In some embodiments, each of the first convex portions 101A may be a portion of the first substrate SUB1 or of the first display panel 100 that protrudes in the second direction DR2 (e.g., towards the second substrate SUB2 or away from the first pixel PXL1) in the plan view, and each of the first concave portions 101B may be a recession of the first substrate SUB1 or of the first display panel 100 in a direction opposite to the second direction DR2 (e.g., away from the second substrate SUB2 or towards the first pixel PXL1) in the plan view. Each of the first convex portions 101A and each of the first concave portions 101B may be alternately arranged with each other along the first direction DR1.

The second uneven pattern 201 may include a plurality of second convex portions 201A and a plurality of second concave portions 201B. Here, each of the second concave portions 201B may be provided between two adjacent second convex portions 201A.

Each of the second concave portions 201B may be provided to be concave in a direction from the second side surface BD1b of the second substrate SUB2 toward the second pixel PXL2 on the plan view, and each of the second convex portions 201A may protrude in a direction opposite to the direction in which the second concave portions 201B are concave. For example, each of the second convex portions 201A may be provided to protrude in a direction toward the first pixel PXL1. In some embodiments, each of the second convex portions 201A may be a portion of the second substrate SUB2 or of the second display panel 200 that protrudes in the direction opposite to the second direction DR2 (e.g., towards the first substrate SUB1 or toward the first pixel PXL1) in the plan view, and each of the second concave portions 201B may be a recession of the second substrate SUB2 or of the second display panel 200 in the second direction DR2 (e.g., away from the first substrate SUB1 or away from the first pixel PXL1). Each of the second concave portions 201B and each of the second convex portions 201A may be alternately arranged with each other along the first direction DR1.

Each of the first convex portions 101A and each of the second concave portions 201B may be disposed to face each other along the second direction DR2, and each of the first concave portions 101B and each of the second convex portions 201A may be disposed to face each other (e.g., along the second direction DR2). Therefore, each of the first convex portions 101A and each of the second concave portions 201B may be interlocked and disposed in the second direction DR2, and each of the first concave portions 101B and each of the second convex portions 201A may be interlocked and disposed (e.g., along the second direction DR2).

Each of the first convex portions 101A and each of the second convex portions 201A may be alternately disposed along the first direction DR1. For example, the first convex portions 101A and the second convex portions 201A may be alternately arranged with each other along the first direction DR1. In addition, each of the first concave portions 101B and each of the second concave portions 201B may be alternately disposed along the first direction DR1. For example, the first concave portions 101B and the second concave portions 201B may be alternately arranged with each other along the first direction DR1.

Referring to FIGS. 4A and 4B, each of the first convex portions 101A may have a protruding semicircle shape, and each of the second concave portions 201B may have a concave semicircle shape that may be disposed in engagement with each of the first convex portions 101A of the protruding semicircle shape. For example, each of the first convex portions 101A may be disposed in engagement with a corresponding one of the second concave portions 201B. Each of the first concave portions 101B may have a concave semicircle shape, and each of the second convex portions 201A may have a protruding semicircle shape that may be disposed in engagement with each of the first concave portions 101B having the concave semicircle shape. For example, each of the second convex portions 201A may be disposed in engagement with a corresponding one of the first concave portions 101B. However, the shape of the disclosure is not limited to the above-described example. For example, each of the first and second convex portions 101A and 201A may have a protruding shape with a rounded curved surface, and each of the first and second concave portions 201B and 201B may have a concave shape with a rounded curved surface.

As shown in FIG. 4B, when each of the first convex portions 101A and each of (e.g., each corresponding one of) the second concave portions 201B are completely engaged and disposed, and each of the first concave portions 101B and each of (e.g., each corresponding one of) the second convex portions 201A are completely engaged and disposed, a width (or a distance) in the second direction DR2 of the first boundary portion BD1 between the first display panel 100 and the second display panel 200 may be reduced.

As described above, when the first convex portions 101A of the first substrate SUB1 and the second concave portions 201B of the second substrate SUB2 are disposed to face each other at the first boundary portion BD1, and the first concave portions 101B of the first substrate SUB1 and the convex portions 201A of the second substrate SUB2 are disposed to face each other, a distance between the first pixel PXL1 and the second pixel PXL2 may be reduced by reducing the width (or the distance) of the first boundary portion BD1 when the first display panel 100 and the second display panel 200 are combined to configure a large area display device. Therefore, securing an attachment margin between the first display panel 100 and the second display panel 200 is easy, thereby minimizing or reducing visual recognition of the boundary portion of the large area display device.

In the first substrate SUB1 corresponding to each of the first convex portions 101A, at least one first hole HA, a first connection electrode 103 provided in the first hole HA, and a first line connector 107 electrically coupled (e.g., connected) to the first connection electrode 103 may be disposed.

In the second substrate SUB2 corresponding to each of the second convex portions 210A, at least one second hole HB, a second connection electrode 203 provided in the second hole HB, and a second line connector 207 electrically coupled (e.g., connected) to the second connection electrode 203 may be disposed.

A more detailed description of the first and second line connectors 107 and 207 is described later with reference to FIG. 5.

Each of the first hole HA and the second hole HB may be provided by passing through a corresponding substrate in the third direction DR3 (e.g., in the plan view). For example, the first hole HA may be provided by passing through the first substrate SUB1 in the third direction DR3 (e.g., in the plan view), and the second hole HB may be provided by passing through the second substrate SUB2 in the third direction DR3 (e.g., in the plan view). In an embodiment, the first hole HA may be an opening in which a region of the first substrate SUB1 is opened, and the second hole HB may be an opening in which a region of the second substrate SUB2 is opened.

The first hole HA may be provided in a peripheral area of the first pixel PXL1 so as to be spaced apart from the first pixel PXL1 positioned closest to the first boundary portion BD1. For example, the first pixel PXL1 may be positioned adjacent (e.g., immediately adjacent) to the first boundary portion BD1. Here, the peripheral area may mean a non-emission area excluding an emission area from which light is emitted from the first pixel PXL1. For example, the peripheral area of the first pixel PXL1 may be an area adjacent to (e.g., around or surrounding) a light emitting element of the first pixel PXL1 in the plan view. The second hole HB may be provided in a peripheral area of the second pixel PXL2 so as to be spaced apart from the second pixel PXL2 positioned closest to the first boundary portion BD1. For example, the second pixel PXL2 may be a pixel adjacent (e.g., immediately adjacent) to the first boundary portion BD1.

The first hole HA may be spaced apart from the first line connector 107 by a minimum or set distance on the plan view. The second hole HB may be spaced apart from the second line connector 207 by a minimum or set distance on the plan view.

The first hole HA and the second hole HB may be alternately disposed with each other in the first direction DR1 (e.g., alternately arranged with each other along the first direction DR1). As shown in FIG. 4B, when the width (or the distance) of the first boundary portion BD1 between the first substrate SUB1 and the second substrate SUB2 is narrow, the first hole HA and the second hole HB may be positioned on the same line in (e.g., along) the first direction DR1. However, the disclosure is not limited thereto. For example, according to an embodiment, the first hole HA and the second hole HB may not be positioned on the same line in the first direction DR1.

Because only the substrates on which the first hole HA and the second hole HB are positioned are different from each other, and the first hole HA and the second hole HB may be provided for the same purpose in the same area of their corresponding substrates and may be formed in the same method, description is given based on the first hole HA.

The first hole HA may be provided in one area of the first substrate SUB1. The first hole HA may be provided in the non-display area of the first substrate SUB1 closest to the first boundary portion BD1 on the plan view, but the disclosure is not limited thereto. According to an embodiment, the first hole HA may also (or alternatively) be provided in the display area of the first substrate SUB1 closest to the first boundary portion BD1 on the plan view.

The first hole HA may be provided to couple (e.g., connect) a configuration provided on an upper surface of the first substrate SUB1 and a configuration provided on a rear surface (e.g., lower surface) of the first substrate SUB1. A connection between the configurations through the first hole HA is described later with reference to FIG. 5.

The first hole HA may be provided (e.g., formed) by irradiating a laser onto the first substrate SUB1 and through an etching process. For example, the laser may be irradiated to form a hole line in the first substrate SUB1, and an etching process of removing one area of the first substrate SUB1 corresponding to the hole line may be performed to provide the first hole HA. The etching process may be a wet etching process, and an etching solution utilized (e.g., used) in the wet etching process may include (e.g., be) hydrofluoric acid (HF) or potassium hydroxide (KOH), but is not limited thereto.

Referring to FIG. 4A, in the first boundary portion BD1, the first side surface BD1a of the first substrate SUB1 and the second side surface BD1b of the second substrate SUB2 may be disposed to be spaced apart from each other.

A connection portion 500 may be provided in a space between the first side surface BD1a and the second side surface BD1b. The connection portion 500 may couple (e.g., connect) the first side surface BD1a and the second side surface BD1b to form a large area display device, for example, a tiled display device.

The connection portion 500 may include (e.g., be) a transparent material capable of transmitting light so that the space between the first side surface BD1a and the second side surface BD1b is not visually recognized.

An optical transparent adhesive film (optical clear adhesive (OCA)) and/or an optical transparent adhesive resin (optical clear resin (OCR)) may be utilized (e.g., used) as the connection portion 500. The optical transparent adhesive film and the optical transparent adhesive resin may be in a very transparent state having a light transmittance of 90% or more.

When coupling (e.g., attaching) the first side surface BD1a of the first substrate SUB1 and the second side surface BD1b of the second substrate SUB2 through the connection portion 500 configured of the above-described materials, image quality of the display device may be further improved by preventing or reducing visual recognition of the first boundary portion BD1, which is the boundary between the first display panel 100 and the second display panel 200.

Figure 5:
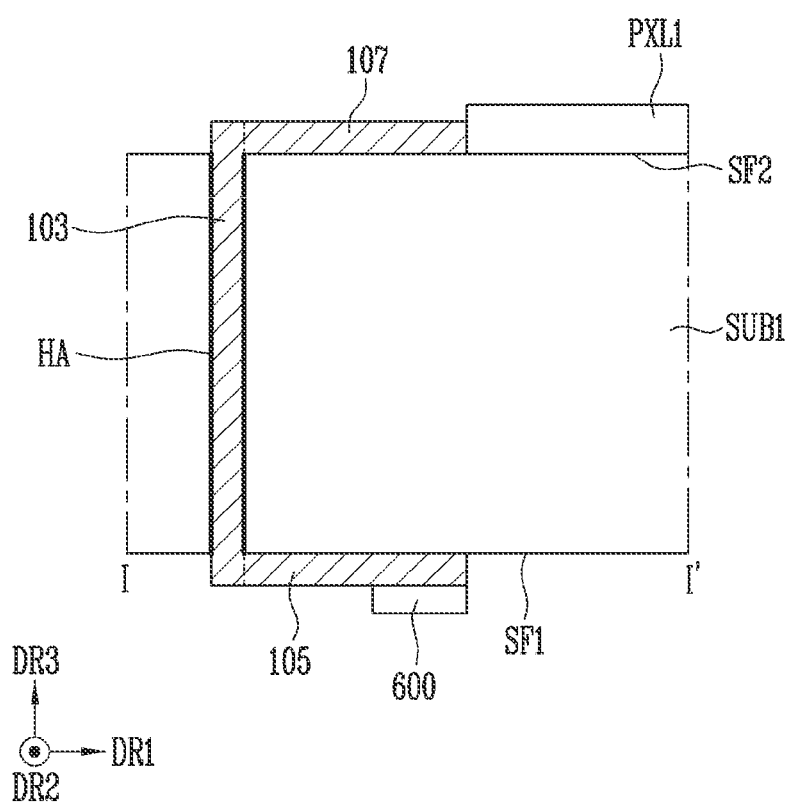
FIG. 5 is a cross-sectional view taken along a line I-I' of FIG. 4B.

FIG. 5 is a cross-sectional view taken along a line I-I' of FIG. 4B.

Referring to FIG. 5, the first substrate SUB1 may include a first surface SF1 and a second surface SF2 facing away (e.g., facing oppositely away) from the first surface SF1.

The first surface SF1 of the first substrate SUB1 may be a lower surface of the first substrate SUB1 when viewed in the third direction DR3 (e.g., when viewed in the plan view), and the second surface SF2 may be an upper surface of the first substrate SUB1 when viewed in the third direction DR3 (e.g., when viewed in the plan view). In an embodiment, an area in which one area of the first substrate SUB1 is opened (or removed) by passing through the first surface SF1 and the second surface SF2 of the first substrate SUB1 may be the first hole HA. For example, the first hole HA may be an opening in the first substrate SUB1 that passes through the first substrate SUB1 from the first surface SF1 to the second surface SF2.

A driving circuit 600 and a driving connector 105 electrically coupled (e.g., connected) to the driving circuit 600 may be provided and/or formed on the first surface SF1 of the first substrate SUB1.

The driving circuit 600 may include the scan driver for supplying the scan signal to the scan line (refer to 'SL' of FIG. 3) electrically coupled (e.g., connected) to the first pixel PXL1, the data driver for supplying the data signal to the data line (refer to 'DL' of FIG. 3), and the like. In addition, the driving circuit 600 may include a voltage supply to supply a predetermined or set voltage to the first pixel PXL1. In an embodiment, the voltage supply may supply the voltage of the first driving power (refer to 'VDD' of FIG. 3) to the first power line (refer to 'PL1' of FIG. 3) coupled (e.g., connected) to the first pixel PXL1, or may supply the voltage of the second driving power (refer to 'VSS' of FIG. 3) to the second power line (refer to 'PL2' of FIG. 3) coupled (e.g., connected) to the first pixel PXL1.

The driving connector 105 may electrically couple (e.g., connect) the first pixel PXL1 and the driving circuit 600 together with the first connection electrode 103. In an embodiment, the driving connector 105 may be a fan-out line that is to transfer a predetermined or set signal and a predetermined or set voltage that is to be transferred from the driving circuit 600 to the first pixel PXL1, but the disclosure is not limited thereto.

The first connection electrode 103 may be provided in the first hole HA. The first connection electrode 103 may be electrically and/or physically coupled (e.g., connected) to the first line connector 107 and to the driving connector 105.

Referring to FIGS. 4B and 5, the first hole HA may have a cylindrical shape on a cross-sectional view, but the disclosure is not limited thereto. According to an embodiment, the first hole HA may have various suitable cross-sectional shapes, such as, for example, a polygon or an ellipse.

The first connection electrode 103 may be provided in the first hole HA. As shown in FIGS. 4B and 5, the first connection electrode 103 may be provided not only inside the first hole HA, but also outside the first hole HA, for example, at (e.g., on) the first surface SF1 and at (e.g., on) the second surface SF2 of the first substrate SUB1, but the disclosure is not limited thereto.

The first line connector 107 may electrically couple (e.g., connect) the first pixel PXL1 and the first connection electrode 103. For example, the first line connector 107 may be electrically and/or physically coupled (e.g., connected) to the first connection electrode 103, and may be provided to transfer a predetermined or set signal and/or a predetermined or set voltage to be supplied from the driving circuit 600 of the first substrate SUB1 to the first pixel PXL1.

Referring to FIG. 5, the first connection electrode 103, the driving connector 105, and the first line connector 107 are shown to be coupled (e.g., connected) in separate configurations, but the disclosure is not limited thereto. For example, the first connection electrode 103 and the driving connector 105 may be integrally configured; the first connection electrode 103 and the first line connector 107 may be integrally formed; or the first connection electrode 103, the driving connector 105, and the first line connector 107 may be integrally formed.

Referring to FIG. 5, the first connection electrode 103, the driving connector 105, and the first line connector 107 may be formed of a conductive material (or substance). For example, the first connection electrode 103, the driving connector 105, and the first line connector 107 may be formed of copper (Cu), silver (Ag), tungsten (W), molybdenum (Mo), aluminum-neodymium (AlNd), titanium (Ti), aluminum (Al), and/or the like.

As shown in FIG. 5, the first connection electrode 103 provided in the first hole HA may be electrically and/or physically coupled (e.g., connected) to the driving connector 105 and to the first line connector 107 to provide (e.g., directly provide) a predetermined or set signal and/or a predetermined or set voltage supplied from the driving circuit 600 to the first pixel PXL1. In this case, separate lines for electrically coupling (e.g., connecting) the driving circuit 600 and the first pixel PXL1 may be omitted. Therefore, an attachment margin between the first display panel 100 and the second display panel 200 may be further secured by reducing the area occupied by the lines in the first boundary (refer to 'BD1' of FIGS. 4A and 4B). Accordingly, visual recognition of the first boundary portion BD1 between the first display panel 100 and the second display panel 200 may be minimized or reduced.

Referring to FIGS. 4A, 4B, and 5, the first convex portions 101A of the first substrate SUB1 and the second concave portions 201B of the second substrate SUB2 are disposed to face each other in the first boundary portion BD1, and the first concave portions 101B of the first substrate SUB1 and the second convex portions 201A of the second substrate SUB2 are disposed to face each other (e.g., in the first boundary portion BD1). In this case, when the first display panel 100 and the second display panel 200 are combined to form a large area display device, the width (or the distance) of the first boundary portion BD1 may be reduced, and thus an attachment margin may be secured.

In addition, the first connection electrode 103 provided in the first hole HA may be electrically and/or physically coupled (e.g., connected) to the driving connector 105 and to the first pixel PXL1 to provide (e.g., directly provide) a predetermined or set signal and/or a predetermined or set voltage from the driving circuit 600 to the first pixel PXL1. Therefore, separate lines for electrically coupling (e.g., connecting) the first pixel PXL1 may be omitted. Accordingly, the width (or the distance) of the first boundary portion BD1 may be reduced by a space of the omitted lines (e.g., by a space that would have otherwise been required for, or occupied by, the separate lines), and thus an attachment margin may be secured.

When the display panels configure a large area display device by the above-described secured attachment margin, visual recognition of the first boundary portion BD1 may be minimized or reduced.

FIG. 6 is an enlarged plan view of the region A of FIG. 1 according to another embodiment.

In FIG. 6, in order to avoid repetitive description, description is given based on differences from the above-described embodiment.

Referring to FIG. 6, the first substrate SUB1 may include at least one first pixel PXL1 and the first line connector 107 electrically and/or physically coupled (e.g., connected) to the first pixel PXL1, and the second substrate SUB2 may include at least one second pixel PXL2 and a second line connector 207 electrically and/or physically coupled (e.g., connected) to the second pixel PXL2.

Each of the first and second pixels PXL1 and PXL2 may include the first sub pixel SP1, the second sub pixel SP2, and the third sub pixel SP3. The first sub pixel SP1, the second sub pixel SP2, and the third sub pixel SP3 may emit light of different colors. For example, the first sub pixel SP1 may be a first color sub pixel that emits light of a first color, the second sub pixel SP2 may be a second color sub pixel that emits light of a second color, and the third sub pixel SP3 may be a third color sub pixel that emits light of a third color. Here, the light of the first color may be light of red, the light of the second color may be light of green, and the light of the third color may be light of blue, but the disclosure is not limited thereto.

However, the color, type, kind, number, and/or the like of the sub pixels configuring each of the first and second pixels PXL1 and PXL2 are/is not particularly limited. For example, the color of light emitted by each sub pixel may be variously and suitably changed.

Each of the first and second line connectors 107 and 207 may include a plurality of line connectors. For example, the first line connector 107 may include a (1-1)-th line connector 107A, a (1-2)-th line connector 107B, and a (1-3)-th line connector 107C. The second line connector 207 may include a (2-1)-th line connector 207A, a (2-2)-th line connector 207B, and a (2-3)-th line connector 207C.

Each of the (1-1)-th to (1-3)-th line connectors 107A, 107B, and 107C may be electrically and/or physically coupled (e.g., connected) to the first connection electrode 103 provided in the first hole HA. At this time, each of the (1-1)-th to (1-3)-th line connectors 107A, 107B, and 107C may be electrically coupled (e.g., connected) to the driving circuit (refer to 600 of FIG. 5) positioned on the rear surface of the first substrate SUB1 through the first connection electrode 103.

Each of the (2-1)-th to (2-3)-th line connectors 207A, 207B, and 207C may be electrically and/or physically coupled (e.g., connected) to the second connection electrode 203 provided in the second hole HB. At this time, each of the (2-1)-th to (2-3)-th line connectors 207A, 207B, and 207C may be electrically coupled (e.g., connected) to a driving circuit positioned on the rear surface of the second substrate SUB2 through the second connection electrode 203.

In FIG. 6, for convenience, the (1-1)-th to (1-3)-th line connectors 107A, 107B, and 107C are not separated from each other. However, the (1-1)-th to (1-3)-th line connectors 107A, 107B, and 107C may be disposed on the first substrate SUB1 to be spaced apart from each other with a predetermined or set distance therebetween, and may be electrically and/or physically separated from each other. For example, each of the (1-1)-th to (1-3)-th line connectors 107A, 107B, and 107C may be electrically and/or physically coupled (e.g., connected) to a corresponding first connection electrode in a corresponding first hole HA. Similarly, in FIG. 6, for convenience, the (2-1)-th to (2-3)-th line connectors 207A, 207B, and 207C are not separated from each other.

However, the (2-1)-th to (2-3)-th line connectors 207A, 207B, and 207C may be disposed on the second substrate SUB2 to be spaced apart from each other with a predetermined or set distance therebetween, and may be electrically and/or physically separated from each other. For example, each of the (2-1)-th to (2-3)-th line connectors 207A, 207B, and 207C may be electrically and/or physically coupled (e.g., connected) to a corresponding second connection electrode in a corresponding second hole HB.

Each of the plurality of line connectors may be electrically coupled (e.g., connected) to each of (e.g., to a corresponding one of) the plurality of sub pixels included in a corresponding pixel. For example, the (1-1)-th line connector 107A may be electrically coupled (e.g., connected) to the first sub pixel SP1 of the first pixel PXL1, the (1-2)-th line connector 107B may be electrically coupled (e.g., connected) to the second sub pixel SP2 of the first pixel PXL1, and the (1-3)-th line connector 107C may be electrically coupled (e.g., connected) to the third sub pixel SP3 of the first pixel PXL1. The (2-1)-th line connector 207A may be electrically coupled (e.g., connected) to the first sub pixel SP1 of the second pixel PXL2, the (2-2)-th line connector 207B may be electrically coupled (e.g., connected) to the second sub pixel SP2 of the second pixel PXL2, and the (2-3)-th line connector 207C may be electrically coupled (e.g., connected) to the third sub pixel SP3 of the second pixel PXL2.

Each of the (1-1)-th to (1-3)-th line connectors 107A, 107B, and 107C may be a line to supply a predetermined or set signal and/or a predetermined or set voltage to a corresponding sub pixel.

In an embodiment, each of the (1-1)-th to (1-3)-th line connectors 107A, 107B, and 107C may be a power line to apply a predetermined or set voltage to a corresponding sub pixel. The power line may be the first power line PL1 and/or the second power line PL2 described with reference to FIG. 3. At this time, the (1-1)-th line connector 107A may be a power line commonly coupled (e.g., connected) to the first sub pixel SP1 of the first pixel PXL1 and to first sub pixels of pixels positioned in the same column (e.g., the same column along the second direction DR2) as the first sub pixel SP1 of the first pixel PXL1. The (1-2)-th line connector 107B may be a power line commonly coupled (e.g., connected) to the second sub pixel SP2 of the first pixel PXL1 and to second sub pixels of pixels positioned in the same column as the second sub pixel SP2 of the first pixel PXL1. The (1-3)-th line connector 107C may be a power line commonly coupled (e.g., connected) to the third sub pixel SP3 of the first pixel PXL1 and to third sub pixels of pixels positioned in the same column as the third sub pixel SP3 of the first pixel PXL1. At this time, each of the (2-1)-th to (2-3)-th line connector 207A, 207B, and 207C may also be power lines to apply a predetermined or set voltage to a corresponding sub pixel.

According to another embodiment, each of the (1-1)-th to (1-3)-th line connectors 107A, 107B, and 107C may be a data line to transfer a data signal to a corresponding sub pixel. Similarly, each of the (2-1)-th to (2-3)-th line connectors 207A, 207B, and 207C may be a data line to transfer a data signal to a corresponding sub pixel.

FIG. 7 is an enlarged plan view of a region B of FIG. 1.

In FIG. 7, in order to avoid repetitive description, description is given based on differences from the above-described embodiment.

Referring to FIG. 7, the first display panel 100 and the third display panel 300 may be disposed adjacent to each other in the first direction DR1. The first display panel 100 may be the first display panel 100 described with reference to FIGS. 4 to 6.

The third display panel 300 may include a third substrate SUB3 and at least one third pixel PXL3 provided on the third substrate SUB3. Here, the third substrate SUB3 may be (e.g., may have the same composition and/or structure as) the substrate SUB described with reference to FIG. 2, and the third pixel PXL3 may be each (e.g., may have the same structure and/or configuration as the) pixel PXL described with reference to FIG. 2. Therefore, detailed description of the third substrate SUB3 and the third pixel PXL3 may not be provided.

A second boundary portion BD2 may be positioned between one side surface BD2a (hereinafter referred to as a 'third side surface') of the third substrate SUB3 and one side surface BD2b (hereinafter referred to as a 'fourth side surface') of the third substrate SUB3 facing each other in the first direction DR1. A connection portion 500 that connects (or couples) the first display panel 100 and the third display panel 300 to each other may be provided at (e.g., on) the second boundary portion BD2. The connection portion 500 may be (e.g., may have the same composition, structure, and/or configuration as) the connection portion 500 described with reference to FIG. 4A.

Each of the third and fourth side surfaces BD2a and BD2b may have uneven patterns 101 and 301 on the plan view. For example, the third side surface BD2a may have a first uneven pattern 101, and the fourth side surface BD2b may have a third uneven pattern 301.

The third uneven pattern 301 may include a plurality of third convex portions 301A and a plurality of third concave portions 301B. Here, each of the third concave portions 301B may be provided between two adjacent third convex portions 301A.

Each of the third convex portions 301A may be provided to protrude in a direction from the fourth side surface BD2b of the third substrate SUB3 toward the first pixel PXL1 on the plan view, and each of the third concave portions 301B may be concave in a direction opposite to the direction in which the third convex portions 301A protrude. For example, each of the third concave portions 301B may be provided to be concave in a direction toward the third pixel PXL3. In some embodiments, the third convex portions 301A may be portions of the third substrate SUB3 or of the third display panel 300 that protrude in a direction opposite to the first direction DR1 (e.g., toward the first substrate SUB1 or towards the first pixel PXL1) in the plan view, and the third concave portions 301B may be recessions in the third substrate SUB3 or in the third display panel 300 in the first direction DR1 (e.g., away from the first substrate SUB1 or away from the first pixel PXL1) in the plan view.

Each of the first convex portions 101A and each of the third concave portions 301B may be disposed to face each other along the first direction DR1, and each of the first concave portions 101B and each of the third convex portions 301A may be disposed to face each other (e.g., in the first direction DR1). Therefore, each of the first convex portions 101A and each of the third concave portions 301B may be disposed in engagement with each other in the first direction DR1, and each of the first concave portions 101B and each of the third convex portions 301A may be disposed in engagement with each other (e.g., in the first direction DR1).

Referring to FIG. 7, at least one third hole HC, a third connection electrode 303 provided in the third hole HC, and a third line connector 307 electrically coupled (e.g., connected) to the third connection electrode 303 may be disposed in the third substrate SUB3 corresponding to each of the third convex portions 301A.

The third hole HC may be provided by passing through the third substrate SUB3 in the third direction DR3 (e.g., in the plan view). For example, the third hole HC may be an opening in the third substrate SUB3 in the plan view. In an embodiment, the third hole HC may be an opening in which one region of the third substrate SUB3 is opened.

The third hole HC may be provided in a peripheral area of the third pixel PXL3 so as to be spaced apart from the third pixel PXL3 positioned closest to the second boundary portion BD2. In some embodiments, the third hole HC may be provided in the display area of the third pixel PXL3. The third hole HC may be spaced apart from the third line connector 307 by a minimum or set distance on the plan view.

The third connection electrode 303 may be provided in the third hole HC and may be electrically and/or physically coupled (e.g., connected) to the third line connector 307. The third connection electrode 303 may be electrically coupled (e.g., connected) to a driving circuit positioned on a rear surface (e.g., lower surface) of the third substrate SUB3.

The third line connector 307 may be a signal line electrically coupled (e.g., connected) to the third pixel PXL3 to apply a predetermined or set signal and/or a predetermined or set voltage to the third pixel PXL3.

The first hole HA and the third hole HC may be alternately disposed in (e.g., alternately arranged with each other along) the second direction DR2. In some embodiments, as shown in FIG. 7, the first hole HA and the third hole HC are not positioned on the same line in (e.g., along) the second direction DR2. However, the disclosure is not limited thereto, and according to an embodiment, the first hole HA and the third hole HC may be positioned on the same line in the second direction DR2.

Figure 8A:
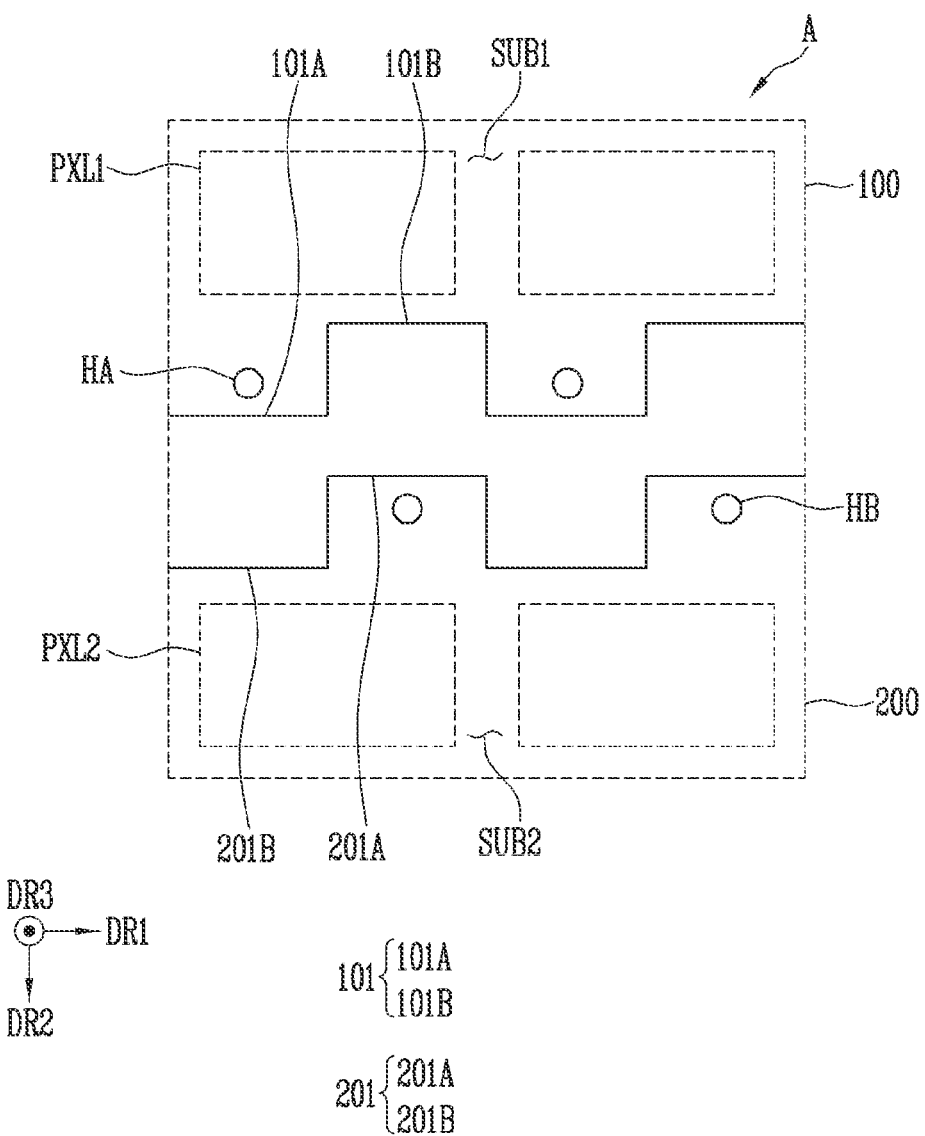

FIGS. 8A and 8B are enlarged plan views of the region A of FIG. 1 according to still another embodiment.

In FIGS. 8A and 8B, in order to avoid repetitive description, description is given based on differences from the above-described embodiment.

Referring to FIGS. 8A and 8B, each of the first convex portions 101A may be provided in a shape complementary to each of (e.g., to a corresponding one of) the second concave portions 201B, and each of the first concave portions 101B may be provided in a shape complementary to each of (e.g., to a corresponding one of) the second convex portions 201A.

Referring to FIG. 8A, each of the first convex portions 101A may be provided in a quadrangle shape protruding in a direction toward the second pixel PXL2, and each of the second concave portions 201B may be provided in a quadrangle shape concave in a direction toward the second pixel PXL2 so as to be disposed in engagement with each of the first convex portions 101A. For example, each of the first convex portions 101A may be a protrusion having a quadrangular shape, and each of the second concave portions 201B may be a recession having a quadrangular shape.

Each of the first concave portions 101B may be provided in a quadrangle shape concave in a direction toward the first pixel PXL1, and each of the second convex portions 201A may be provided in a quadrangle shape protruding in a direction toward the first pixel PXL1 so as to be disposed in engagement with each of the first concave portions 101B. For example, each of the first concave portions 101B may be a recession having a quadrangular shape, and each of the second convex portions 201A may be a protrusion having a quadrangular shape.

Referring to FIG. 8B, a portion of each of the first convex portions 101A and a portion of each of the second concave portions 201B may be engaged and disposed, and a portion of each of the first concave portions 101B and a portion of each of the second convex portions 201A may be engaged and disposed. However, the disclosure is not limited thereto, and each of the first convex portions 101A and each of the second concave portions 201B may be completely engaged and disposed, and each of the first concave portions 101B and each of the second convex portions 201A may be completely engaged and disposed. In some embodiments, a portion of a first side surface of the first display panel 100 facing a second side surface of the second display panel 200 along the second direction DR2 may contact (e.g., directly or physically contact) the second side surface of the second display panel 200. In some embodiments, the first side surface of the first display panel 100 and the second side surface of the second display panel 200 are not spaced apart from each other along the second direction DR2 in the plan view.

In FIGS. 8A and 8B, the shape of each of the first and second convex portions 101A and 201A is shown as the protruding quadrangle shape, and the shape of each of the first and second concave portions 101B and 201B is shown as the concave quadrangle shape, but the disclosure is not limited thereto. Each of the first and second convex portions 101A and 201A may have various suitable shapes complementary to the first and second concave portions 101B and 201B so as to be disposed in engagement with the first and second concave portions 101B and 201B facing therewith.

When the first display panel 100 and the second display panel 200 are combined to form a large area display device, the width (or the distance) between the first display panel 100 and the second display panel 200 may be a width (or a distance) at which each of the first convex portions 101A and each of the second concave portions 201B are engaged and disposed and/or a width (or a distance) at which each of the first concave portions 101B and each of the second convex portions 201A are engaged and disposed.

In a large area display device, the attachment margin between the first display panel 100 and the second display panel 200 may be further secured by the width (or the distance) at which the respective first and second convex portions 101A and 201A and of the respective first and second concave portions 101B and 201B facing therewith are engaged and disposed. Therefore, visual recognition of the boundary between the first display panel 100 and the second display panel 200 may be minimized or reduced.

FIGS. 9 to 14 are plan views illustrating an example of one display panel in the region A of FIG. 1.

In FIGS. 9 to 14, in order to avoid repetitive description, description is given based on differences from the above-described embodiment.

Figure 9:
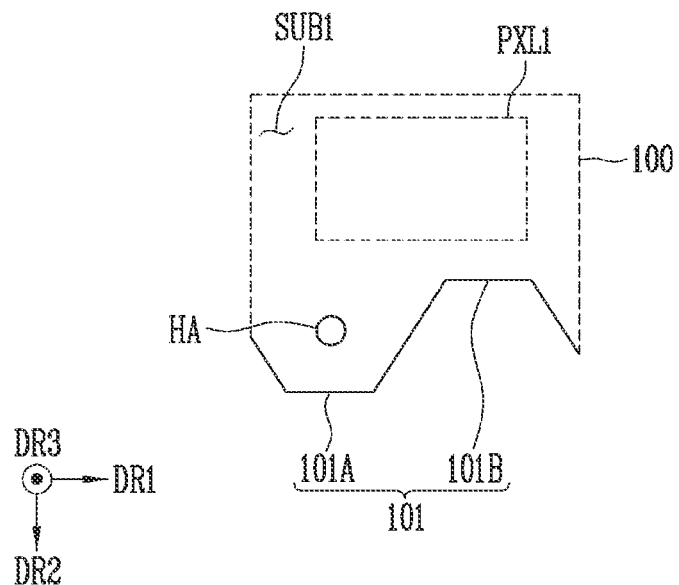
FIGS. 9 to 14 are plan views illustrating an example of one display panel in the region A of FIG. 1.
Figure 10:
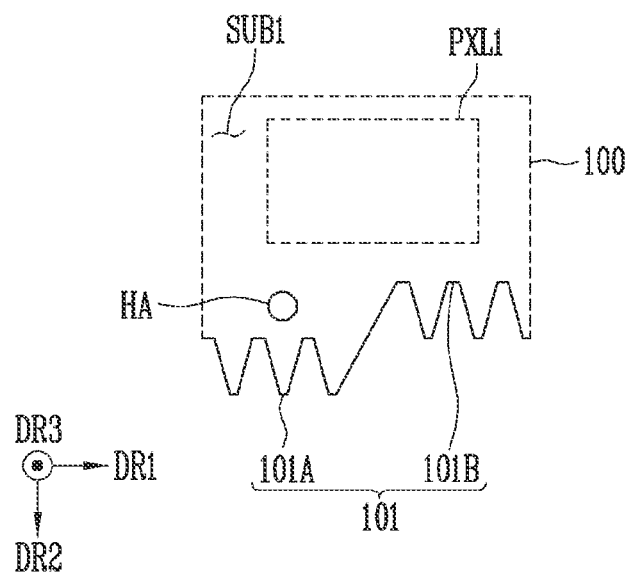

Referring to FIGS. 9 and 10, one side surface of the first substrate SUB1 may have a first uneven pattern 101 on the plan view. The first uneven pattern 101 may include a first convex portion 101A and a first concave portion 101B.

Referring to FIG. 9, the first convex portion 101A may be provided in (e.g., may have) a protruding trapezoid shape, and the first concave portion 101B may be provided in (e.g., may have) a concave trapezoid shape.

Referring to FIG. 10, the first convex portion 101A included in the first uneven pattern 101 may be provided in a shape including a plurality of sub patterns of a protruding castle shape. In addition, the first concave portion 101B included in the first uneven pattern 101 may be provided in a shape including a plurality of sub patterns of a concave castle shape. The castle shape may be any suitable shape. In some embodiments, the castle shape may be a polygon shape such as a quadrangle, a trapezoid, or a triangle. In some embodiments, the castle shape may be a shape having at least one curved surface.

However, the shape of the first uneven pattern 101 is not limited to the above-described shape, and may be variously and suitably modified according to a design of the display device. For example, the first uneven pattern 101 including the first convex portion 101A and the first concave portion 101B may be provided in a shape including a non-square (or irregular) boundary, not a standardized shape. In this case, the first convex portion 101A may include a plurality of sub patterns having a width and/or a thickness that are not constant from each other (e.g., that are not uniform), and the first concave portion 101B may include a plurality of sub patterns having a width and/or a thickness that are not constant from each other (e.g., that are not uniform).

Referring to FIGS. 9 and 10, one first hole HA may be provided in the first substrate SUB1 corresponding to the first convex portion 101A. The first hole HA may be electrically coupled (e.g., connected) to one first pixel PXL1 adjacent to the first hole HA through the first line connector.

The shapes of the first convex portion 101A and the first concave portion 101B shown in FIGS. 9 and 10 are examples, and the disclosure is not limited thereto.

Figure 11:
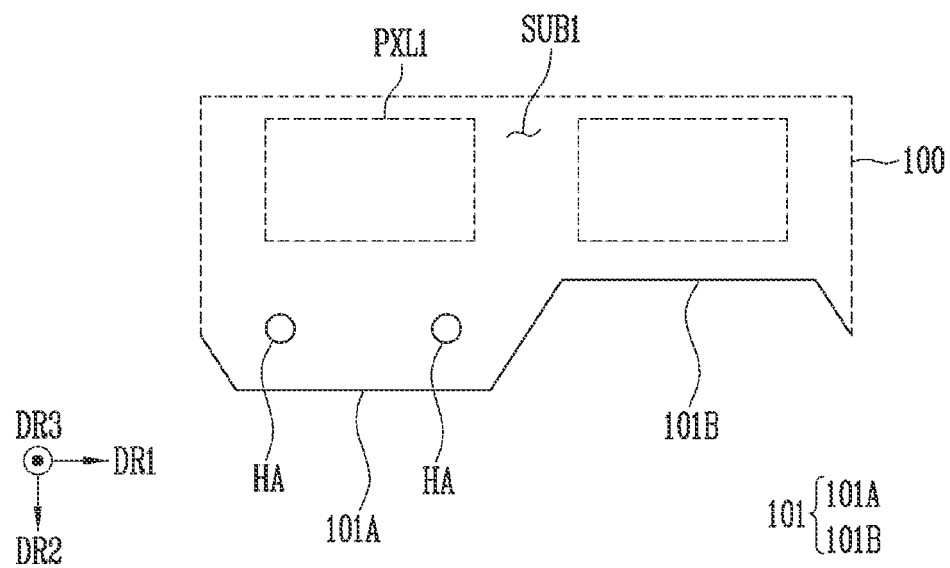
Figure 12:
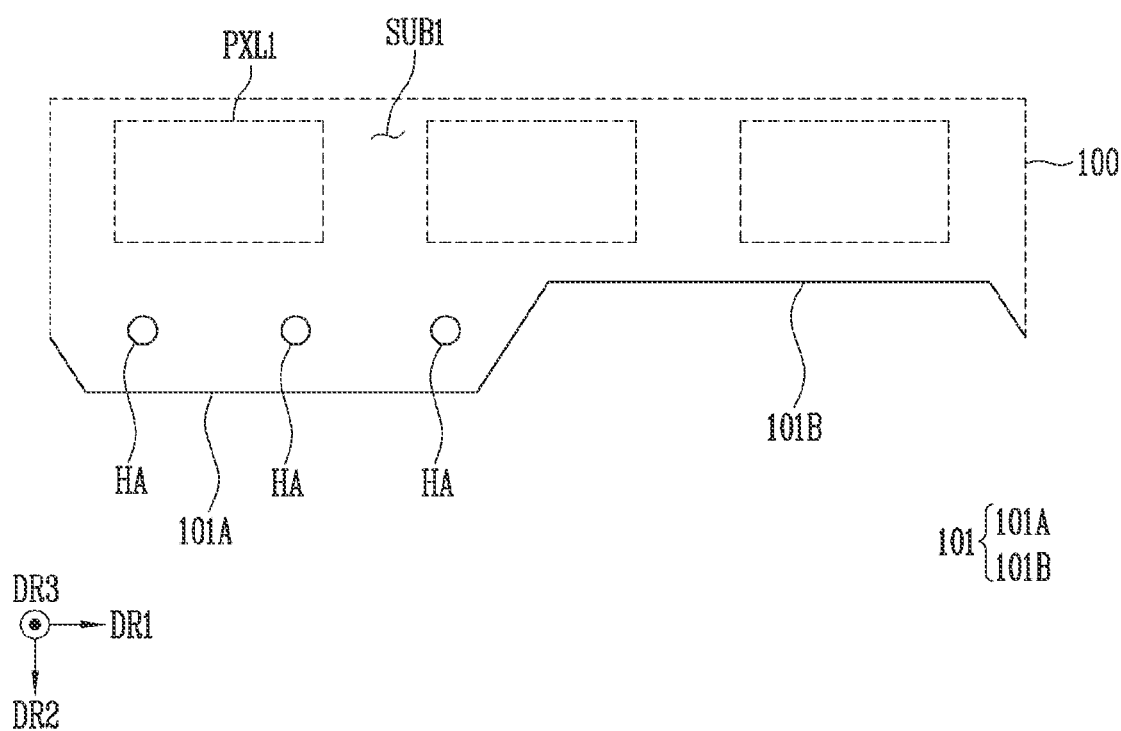

Referring to FIGS. 11 and 12, a plurality of first holes HA may be provided in the first substrate SUB1 corresponding to the first convex portion 101A. The first line connector (refer to 107 of FIG. 4A) is provided in correspondence with the number of the plurality of first holes HA. Each of the first holes HA is electrically coupled (e.g., connected) to a corresponding first pixel PXL1 through the first connection electrode (refer to 103 of FIG. 4A) provided in the first hole HA and the first line connector electrically coupled (e.g., connected) to the first connection electrode.

Referring to FIG. 11, two first holes HA may be provided in the first substrate SUB1 corresponding to the first convex portion 101A. The first line connector corresponding to each of the two first holes HA may be provided. Connection electrodes may be formed inside the two first holes HA, respectively. The connection electrode formed in the first hole HA of one of the two first holes HA may be electrically coupled (e.g., connected) to any one of the two adjacent first pixels PXL1 through a corresponding first line connector. The connection electrode formed in the remaining first hole HA of the two first holes HA may be electrically coupled (e.g., connected) to the other of the two adjacent first pixels PXL1 through a corresponding first line connector.

Referring to FIG. 12, three first holes HA may be provided in the first substrate SUB1 corresponding to the first convex portion 101A. Three first line connectors corresponding to the respective three first holes HA may be provided. Any one of the three first line connectors may be electrically coupled (e.g., connected) to one pixel PXL1 among the three adjacent first pixels PXL1 through the connection electrode formed in one first hole HA among the three first holes HA. In addition, another of the three first line connectors may be electrically coupled (e.g., connected) to another pixel PXL1 among the three adjacent first pixels PXL1 through the connection electrode formed in another first hole HA among the three first holes HA. Additionally, the remaining one of the three first line connectors may be electrically coupled (e.g., connected) to the remaining pixel PXL1 among the three adjacent first pixels PXL1 through the connection electrode formed in the remaining first hole HA among the three first holes HA.

Figure 13:
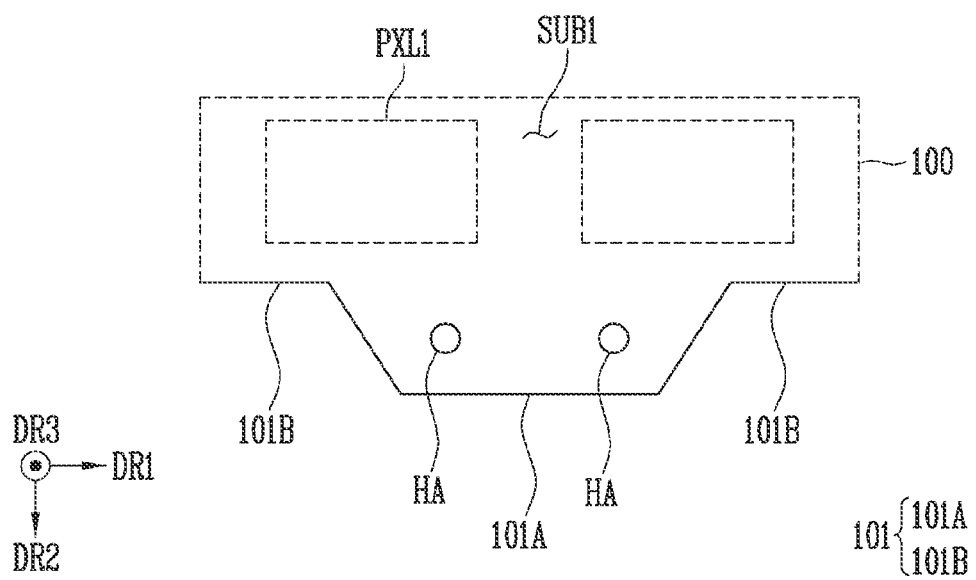
Figure 14:
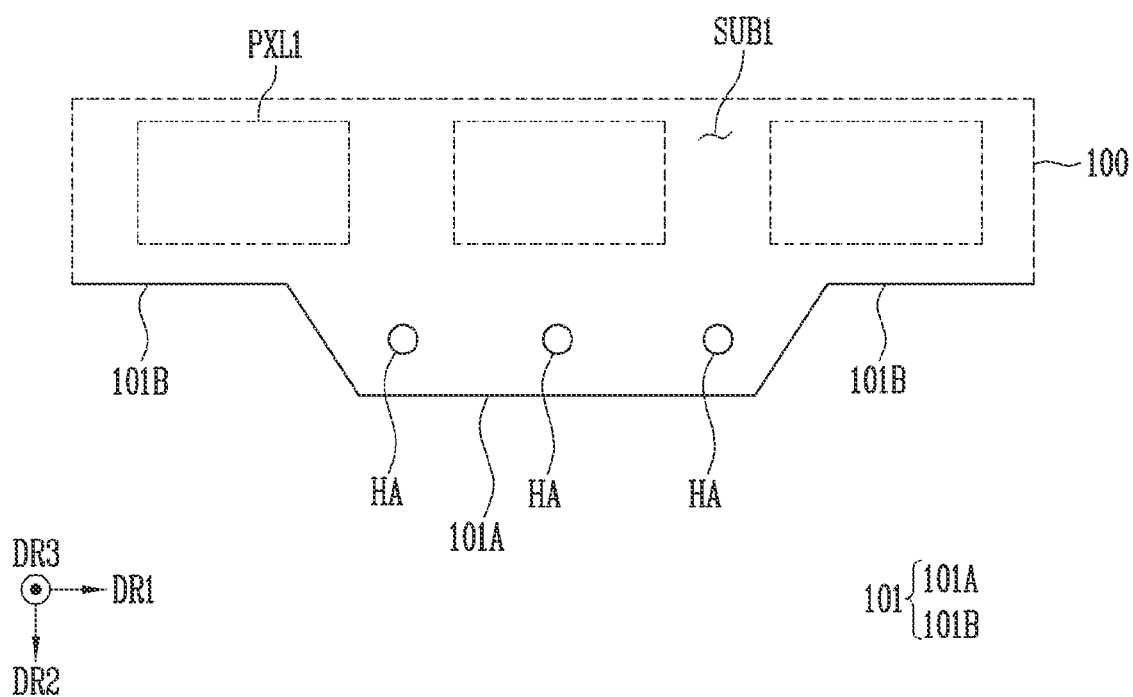

Referring to FIGS. 13 and 14, the first convex portion 101A and the first concave portion 101B may be provided regardless of (e.g., independent from) a position of the first pixel PXL1 provided on the first substrate SUB1.

Referring to FIG. 13, two first pixels PXL1 adjacent in the first direction DR1 may be provided on the first substrate SUB1. The first convex portion 101A may be provided on the first substrate SUB1 so as to correspond to an inner area of each of the two adjacent first pixels PXL1 on the plan view, and the first concave portion 101B may be provided on the first substrate SUB1 to correspond to the remaining area other than the inner area of each of the two first pixels PXL1. For example, the first convex portion 101A may correspond to (e.g., may overlap along the second direction DR2) the area between the two adjacent first pixels PXL1 and also correspond to a portion of each of the two adjacent first pixels PXL1 that is adjacent to (e.g., closest to) the area between the two adjacent first pixels PXL1.

According to an embodiment, as shown in FIG. 14, the first convex portion 101A may be provided to partially correspond to the three first pixels PXL1 adjacent in the first direction DR1, and the first concave portion 101B may be provided to partially correspond to each of the two first pixels PXL1 positioned outside of the three first pixels PXL1. For example, the first convex portion 101A may correspond to the center first pixel PXL1 of the three first pixels PXL1 and also to a portion of each of the other two first pixels PXL1 that is adjacent to (e.g., closest to) the center first pixel PXL1. However, the positions and shapes of the first convex portion 101A and the first concave portion 101B in the first substrate SUB1 are not limited to the above-described embodiment.

Although the disclosure has been described with reference to the embodiments disclosed above, those of ordinary skill in the art and those having a common knowledge in the art will understand that the disclosure may be variously and suitably modified and changed without departing from the spirit and technical area of the disclosure as described in the claims and equivalents thereof, which will be described later.

Therefore, the technical scope of the disclosure should not be limited to the contents described in the detailed description of the specification, but should be defined by the claims and equivalents thereof.

What is claimed is:

1. A display device comprising:
   a first display panel comprising a first substrate and at least one first pixel on one surface of the first substrate; and
   a second display panel adjacent to the first display panel in a first direction and comprising a second substrate and at least one second pixel on one surface of the second substrate,
   wherein:
   one side surface of each of the first and second substrates adjacent to a first boundary between the first display panel and the second display panel comprises an uneven pattern;
   the uneven pattern of the first substrate comprises a plurality of first convex portions and a plurality of first concave portions between the first convex portions, the uneven pattern of the second substrate comprises a plurality of second convex portions and a plurality of second concave portions between the second convex portions;
   each of the first convex portions comprises at least one first hole passing through the first substrate, and each of the second convex portions comprises at least one second hole passing through the second substrate;
   the first hole and the second hole are alternately arranged with each other along a second direction different from the first direction in a plan view; and
   the first convex portions and the second convex portions are alternately arranged with each other along the second direction.

2. The display device according to claim 1, wherein each of the first convex portions is convex toward the second pixel, and each of the first concave portions is concave toward the first pixel, in the plan view, and
   wherein each of the second convex portions is convex toward the first pixel, and each of the second concave portions is concave toward the second pixel, in the plan view.

3. The display device according to claim 2, wherein the first concave portions and the second concave portions are alternately arranged with each other along the second direction.

4. The display device according to claim 3, wherein each of the first convex portions and a corresponding one of the second concave portions face each other in the first direction, and
   wherein each of the second convex portions and a corresponding one of the first concave portions face each other in the first direction.

5. The display device according to claim 4, wherein each of the first concave portions has a shape complementary to a corresponding one of the second convex portions, and
   wherein each of the second concave portions has a shape complementary to a corresponding one of the first convex portions.

6. The display device according to claim 5, wherein each of the first convex portions and each of the second convex portions comprises a non-square boundary.

7. The display device according to claim 5, wherein each of the first convex portions and each of the second convex portions has a polygonal shape or a rounded curved shape.

8. The display device according to claim 1, wherein the number of the first holes and the number of the first pixels are the same.

9. The display device according to claim 1, further comprising:
   a third display panel adjacent to the first display panel in the second direction, and comprising a third substrate and at least one third pixel on one surface of the third substrate,
   wherein one side surface of the third substrate adjacent to a second boundary between the first display panel and the third display panel comprises an uneven pattern,
   wherein the uneven pattern of the third substrate comprises a plurality of third convex portions and a plurality of third concave portions between the third convex portions, and
   wherein each of the third convex portions comprises at least one third hole passing through the third substrate.

10. The display device according to claim 1, further comprising:
    a connection portion at the first boundary between the first display panel and the second display panel.

11. The display device according to claim 10, wherein the connection portion comprises a transparent adhesive material.

12. A display device comprising:
a first display panel comprising a first substrate and at least one first pixel on one surface of the first substrate; and
a second display panel adjacent to the first display panel in a first direction and comprising a second substrate and at least one second pixel on one surface of the second substrate,
wherein:
one side surface of each of the first and second substrates adjacent to a first boundary between the first display panel and the second display panel comprises an uneven pattern;
the uneven pattern of the first substrate comprises a plurality of first convex portions and a plurality of first concave portions between the first convex portions, the uneven pattern of the second substrate comprises a plurality of second convex portions and a plurality of second concave portions between the second convex portions;
each of the first convex portions comprises at least one first hole passing through the first substrate, and each of the second convex portions comprises at least one second hole passing through the second substrate; and
the first display panel further comprises a first connection electrode inside the first hole.

13. The display device according to claim 12, wherein the first hole and the second hole are alternately arranged with each other along a second direction different from the first direction in a plan view.

14. The display device according to claim 13, wherein each of the first convex portions is convex toward the second pixel, and each of the first concave portions is concave toward the first pixel, in the plan view, and
wherein each of the second convex portions is convex toward the first pixel, and each of the second concave portions is concave toward the second pixel, in the plan view.

15. The display device according to claim 14, wherein the first display panel further comprises:
at least one first line connector on the one surface of the first substrate and electrically coupled to the first pixel,
wherein the first connection electrode is electrically coupled to the first line connector, and
wherein the second display panel further comprises:
at least one second line connector on the one surface of the second substrate and electrically coupled to the second pixel; and
a second connection electrode inside the second hole and electrically coupled to the second line connector.

16. The display device according to claim 15, wherein the first line connector and the first connection electrode are integrally provided, and
wherein the second line connector and the second connection electrode are integrally provided.

17. The display device according to claim 15, wherein the first display panel further comprises:
a driving circuit on another surface of the first substrate facing oppositely away from the one surface of the first substrate; and
a driving connector on the other surface of the first substrate and electrically coupling the driving circuit and the first connection electrode.

18. The display device according to claim 17, wherein the driving connector and the first connection electrode are integrally provided.

19. The display device according to claim 17, wherein the first line connector, the first connection electrode, and the driving connector are integrally provided.

20. The display device according to claim 17, wherein the first pixel comprises a first sub pixel, a second sub pixel, and a third sub pixel, and
wherein the first line connector comprises:
a (1-1)-th line connector electrically coupled to the first sub pixel;
a (1-2)-th line connector electrically coupled to the second sub pixel; and
a (1-3)-th line connector electrically coupled to the third sub pixel.

21. The display device according to claim 20, wherein each of the (1-1)-th to (1-3)-th line connectors is electrically coupled to the first connection electrode.

* * * * *